US010833581B1

(12) United States Patent
Zilio et al.

(10) Patent No.: US 10,833,581 B1
(45) Date of Patent: Nov. 10, 2020

(54) MUTI-LEVEL HYBRID FLYING CAPACITOR CONVERTER CONTROL

(71) Applicant: Infineon Technologies AG, Neubiberg (DE)

(72) Inventors: Nicolo Zilio, Villach (AT); Andreas Berger, Klagenfurt (AT); Marc Kanzian, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/420,733

(22) Filed: May 23, 2019

(51) Int. Cl.
*H02M 3/07* (2006.01)
*G01R 19/00* (2006.01)

(52) U.S. Cl.
CPC .......... *H02M 3/07* (2013.01); *G01R 19/0084* (2013.01); *Y02B 70/1466* (2013.01)

(58) Field of Classification Search
CPC .................. H02M 3/07; H02M 3/135; H02M 3/155–158; H02M 3/1588; Y02B 70/1466; G01R 19/0084
USPC ....... 323/222, 234, 235, 241, 265, 271, 280, 323/28, 283
See application file for complete search history.

(56) References Cited

U.S. PATENT DOCUMENTS

| | | | |
|---|---|---|---|
| 6,995,995 B2* | 2/2006 | Zeng ....................... | H02M 3/07 327/536 |
| 7,902,800 B2* | 3/2011 | Jain ...................... | H02M 3/1588 323/224 |
| 7,919,952 B1* | 4/2011 | Fahrenbruch ......... | H02M 3/156 323/222 |
| 9,110,480 B2* | 8/2015 | Babazadeh ............... | G05F 3/02 |
| 2008/0158914 A1* | 7/2008 | Bakker ............. | H02M 3/33515 363/17 |
| 2009/0230930 A1* | 9/2009 | Jain ..................... | H02M 3/1588 323/234 |
| 2010/0165688 A1* | 7/2010 | Bendre ................... | H02M 7/49 363/137 |
| 2014/0097818 A1* | 4/2014 | Wiktor .................. | H02M 3/156 323/283 |
| 2018/0019667 A1* | 1/2018 | Salem ..................... | H02M 3/07 |
| 2018/0124529 A1* | 5/2018 | Larsen .................. | H04R 25/00 |
| 2018/0234011 A1* | 8/2018 | Muramatsu ............ | B60Q 1/382 |

* cited by examiner

*Primary Examiner* — Yemane Mehari
(74) *Attorney, Agent, or Firm* — Schiff Hardin LLP

(57) ABSTRACT

A control system, and corresponding method, for a Multi-Level Hybrid Flying Capacitor (MLHFC) converter. The control system includes a controller configured to control an output of the MLHFC converter; a feedback region detector configured to detect a change in a feedback region of the MLHFC converter; and a controller adjuster configured to, in response to the detected change, adjust the control system to counteract instability.

20 Claims, 4 Drawing Sheets

300
Method of a Control System
Controlling a MLHFC Converter

MUTI-LEVEL HYBRID FLYING CAPACITOR CONVERTER CONTROL

BACKGROUND

The present disclosure is directed to flying capacitor instability detection and correction in Multi-Level Hybrid Flying Capacitor (MLHFC) converters.

Reliable control of an MLHFC converter ensures that its flying capacitor is properly balanced under all conditions and prevents flying capacitor voltage drift. Flying capacitor instability may cause a converter component to sustain full output voltage or full input voltage, which may be higher than the component's maximum voltage rating. This results in reduced lifetime, performance, reliability, and in the end, permanent damage to the converter's power stage.

Flying capacitor balancing is typically achieved by adapting duty cycles of switch control signals in different switching phases. A fundamental issue with this approach is that the feedback sign from a change in duty cycle to a change in flying capacitor voltage depends on system parameters such as load current, input voltage, output voltage, switching frequency, and inductance value. Different feedback regions therefore exist. This is detrimental for control law because the feedback may accelerate, rather than compensate for, flying capacitor voltage drift.

Voltage Mode Control (VMC) methods overcome flying capacitor instability using techniques such as dual edge modulation. This technique cannot be applied to other control methods such as Current Mode Control (CMC) and Sliding Mode Control (SMC). CMC and SMC have better dynamic performance and overcurrent protection in comparison to VMC so are often preferred methods. It is thus important to have a flying capacitor instability detection and correction solution that works with various control schemes.

DETAILED DESCRIPTION

The present disclosure is directed to a control system that balances a flying capacitor voltage by detecting a feedback region without any additional measurements or assumptions, and then adapts a feedback sign accordingly.

Figure 1A:
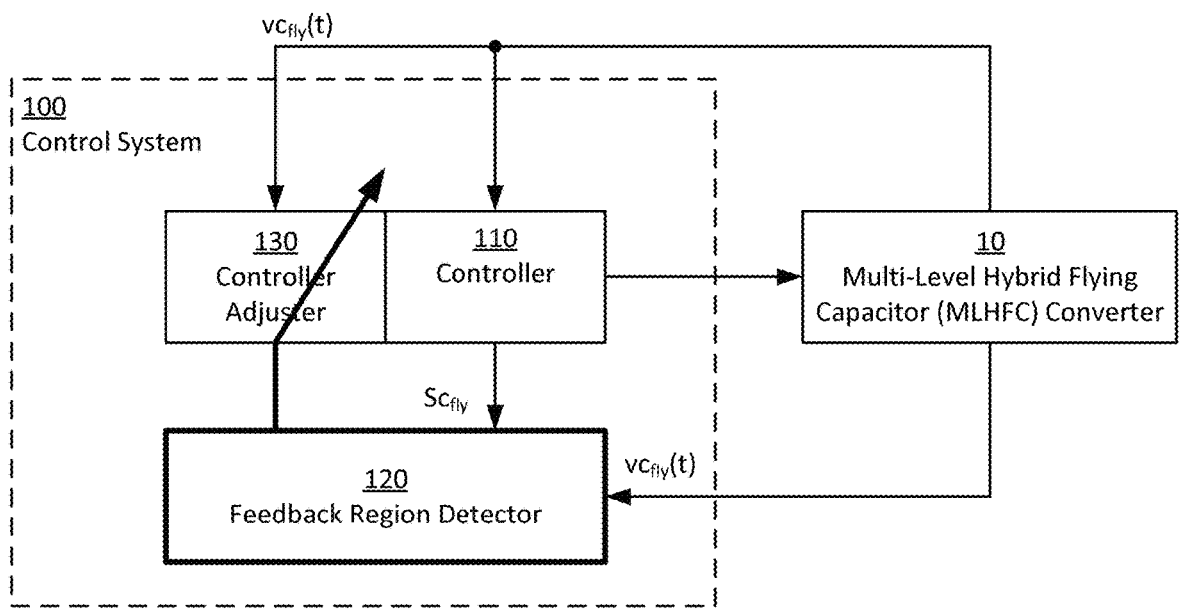
FIGS. 1A and 1B illustrate schematic diagrams of a control system and a Multi-Level Hybrid Flying Capacitor (MLHFC) converter in accordance with aspects of the disclosure.
Figure 1B:
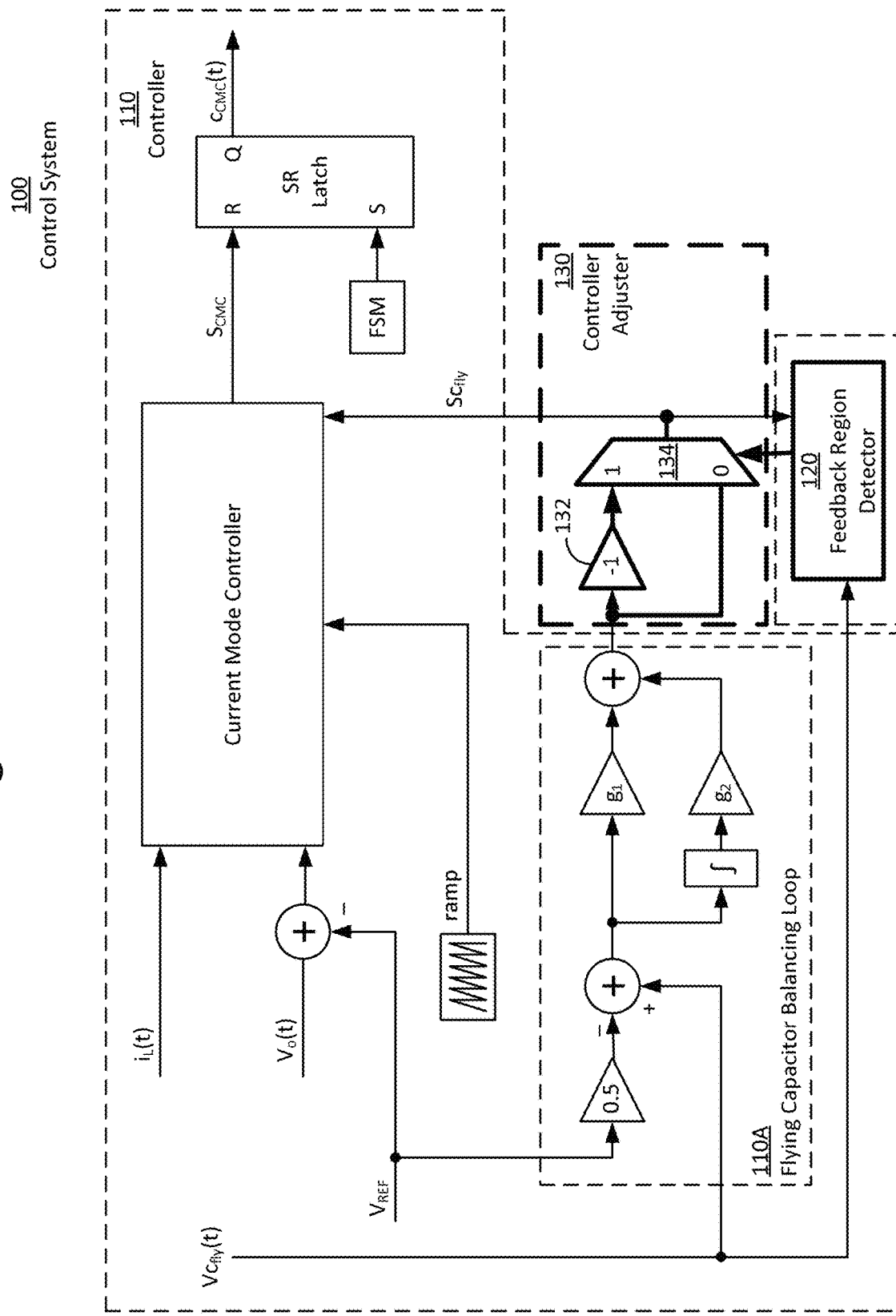

FIGS. 1A and 1B illustrate schematic diagrams of a control system 100 and a Multi-Level Hybrid Flying Capacitor (MLHFC) converter 10 in accordance with aspects of the disclosure.

The MLHFC converter 10 may be any MLHFC converter. For example, the converter 10 may be a step-up (boost) converter, step-down (buck) converter, a step-down/step-up (buck/boost) converter, or the like. The topology of the MLHFC converter 10 may have any number of flying capacitors, levels, and phases. For example, the MLHFC converter 10 may comprise a single flying capacitor and have three-levels. Alternatively, the MLHFC converter 10 may comprise a plurality of flying capacitors, in which case, each of the flying capacitors corresponds with a respective pair of feedback region detector 120 and controller adjuster 130 as described below.

The control system 100 comprises a controller 110, a feedback region detector 120, and a controller adjuster 130. At least one of the feedback region detector 120 and the controller adjuster 130 may be part of the controller 110, or alternatively, separate from the controller 110.

The controller 110 is configured to control an output of the MLHFC converter 10 and is controller-architecture independent. The MLHFC converter 10 may be a three-level flying capacitor boost converter 10. The controller 110 may be configured to perform Sliding Mode Control (SMC), a Current Mode Control (CMC), a Voltage Mode Control (VMC), a Proportional Integral Derivative (PID) control, a hysteresis control, a non-linear control, or the like. The controller 110 may use a flying capacitor balancing loop, and the flying capacitor balancing loop may be part of the controller 110, or alternatively, separate from the controller 110. In the example shown, the controller 110 is configured to perform CMC and flying capacitor balance using a flying capacitor balancing loop 110A. The CMC controller 110 shown is for a single capacitor three-level MLHFC converter 10, and the flying capacitor balancing loop 110A maintains the flying capacitor voltage $V_{Cfly}$. The CMC controller 110 is described briefly below. Controllers 110 configured to perform CMC and flying capacitor balancing loops 110A are known, and for the sake of brevity, further detailed descriptions are omitted.

The feedback region detector 120 is configured to detect a change in a feedback region of the MLHFC converter 10 by monitoring a property of a flying capacitor voltage $V_{Cfly}$ of the MLHFC converter 10, and a property of a control signal $S_{Cfly}$ of the control system 100. Using the CMC controller 110 shown, the property of the flying capacitor voltage $V_{Cfly}$ is a sign of a derivative of the flying capacitor voltage, $$\text{sgn}\left(\frac{dV_{Cfly}}{dt}\right),$$

of the MLHFC converter 10. The property of the control signal is a sign of a derivative of the control signal, $$\text{sgn}\left(\frac{dS_{Cfly}}{dt}\right),$$

of the control system, 100. Since the flying capacitor voltage $V_{Cfly}$ is sensed for its balancing, no additional hardware is required. Furthermore, in a digital controller, all control signals are readily available and can be further processed.

The feedback region detector 120 is configured to detect the change in the feedback region from a Negative Feedback region (NFB) to a Positive Feedback region (PFB) when the sign of the derivative of the flying capacitor voltage, $$\text{sgn}\left(\frac{dV_{Cfly}}{dt}\right),$$

and the sign of the derivative of the control signal, $$\text{sgn}\left(\frac{dS_{Cfly}}{dt}\right),$$

are not equal. Alternatively, the feedback region detector 120 is configured to detect the change in the feedback region from a PFB to a NFB when the sign of the derivative of the flying capacitor voltage, $$\text{sgn}\left(\frac{dv_{Cfly}}{dt}\right),$$

and the sign of the derivative of the control signal, $$\text{sgn}\left(\frac{dS_{Cfly}}{dt}\right),$$

are equal.

The controller adjuster 130 is configured to, if the feedback region detector 120 detects a change in the feedback region, adjust the control system 100 by inversing a sign of the control signal $S_{Cfly}$ of the controller 110 to counteract instability due to the changed feedback region. The change in the feedback region of the MLHFC converter 10 may be from a NFB to a PFB, or from a PFB to a NFB. The controller adjuster 130 comprises an inverter 132 and a multiplexer 134 as an example configuration, and inverses the sign of the flying capacitor balancing by the multiplexer selecting, in response to a select signal from the feedback region detector 120, an inverted version of the control signal output by the inverter 132. The flying capacitor voltage $V_{Cfly}$ is thus balanced without switching between controllers or employing special modulation schemes.

The instability may result from an operating point change of the MLHFC converter 10. Also, the instability may result from a parameter change of the MLHFC converter 10. Since this instability can be counteracted, the feedback region detector 120 and controller adjuster 130 are therefore configured to operate independently of parameters of the MLHFC converter 10, wherein the parameters may comprise a load current, an input voltage, an output voltage, a switching frequency, and/or an inductance.

The control system 100 is also independent of the control method. FIG. 1B shows a controller 110 configured to perform CMC to determine the state of the MLHFC converter switches.

The control signal, which dictates the switching decision, is provided by:

$$c_{CMC} = \begin{cases} 0, & S > 0 \\ 1, & S < 0 \end{cases} \quad \text{Equation (2)}$$

The control signal $c_{CMC}$, which determines the states of the control switches of the MLHFC converter 10, is then obtained by evaluating S_CMC.

Here, a constant frequency implementation is used. To that end, the control signal $c_{CMC}$ is set to 1 by a constant clock signal generated by a Finite State Machine (FSM), and reset to 0 if S_CMC>0. The FSM is used to select the appropriate group of MLHFC converter switches.

For a boost converter, the flying capacitor voltage is stabilized at $$\frac{V_o}{2}$$

for a three-level converter. In general, the flying capacitor voltages are stabilized at a fraction of the output voltage. The flying capacitor voltage balancing is achieved by the $S_{Cfly}$ control signal. As a first step, the sign is determined by the FSM assuming operation in the default NFB. This causes the time instants at which the reset of an SR latch in the controller 110 is triggered by S_CMC>0 to be different for the two sub-phases, for example, if in the first sub-phase, in which the first switching group is controlled, the flying capacitor is charged, in the second sub-phase, in which the second switching group is controlled, the flying capacitor is discharged. Consequently, the duty cycles of the two switching groups are modified in opposite directions, resulting in a balancing of the flying capacitor voltage $V_{Cfly}$.

A core of the control system 100 is the feedback region detection and the subsequent adaptation of the sign of $S_{Cfly}$, reversing the sign selected by the FSM if operation in the PFB is detected. In this implementation, the feedback region is detected as follows.

First, the sign of the slope of the flying capacitor voltage, $$\text{sgn}\left(\frac{dv_{Cfly}}{dt}\right),$$

is detected.

Second, the sign of the slope of the flying capacitor balancing control signal, $$\text{sgn}\left(\frac{dS_{Cfly}}{dt}\right),$$

is detected.

The correct feedback region (FB) is then determined by the following:

$$FB = \begin{cases} PFB, \text{sgn}\left(\frac{dv_{Cfly}}{dt}\right) \neq \text{sgn}\left(\frac{dS_{Cfly}}{dt}\right) \text{ and } NFB \\ NFB, \text{sgn}\left(\frac{dv_{Cfly}}{dt}\right) = \text{sgn}\left(\frac{dS_{Cfly}}{dt}\right) \text{ and } PFB \end{cases} \quad \text{Equation (3)}$$

If NFB is detected, the feedback sign as selected by the FSM is used, as it is assumed that operation is in the default negative feedback region NFB. Otherwise, if PFB is detected, the sign of $S_{Cfly}$, as determined by the FSM, is reversed. The feedback region detector 130 may be implemented as digital or analog circuitry.

Figure 2A:
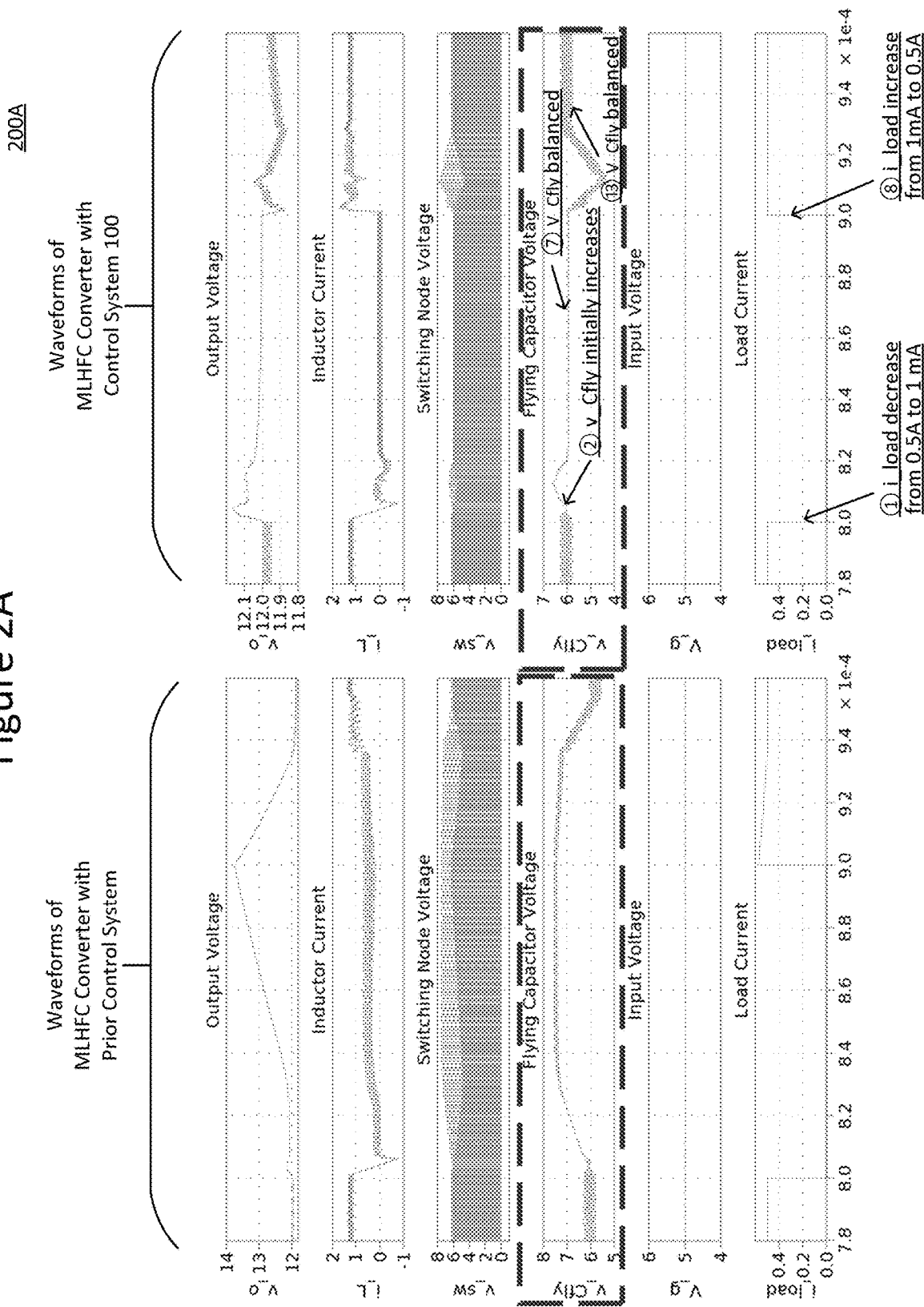
FIGS. 2A and 2B illustrate waveforms comparing a known control system and the disclosed control system of FIGS. 1A and 1B in accordance with aspects of the disclosure.
Figure 2B:
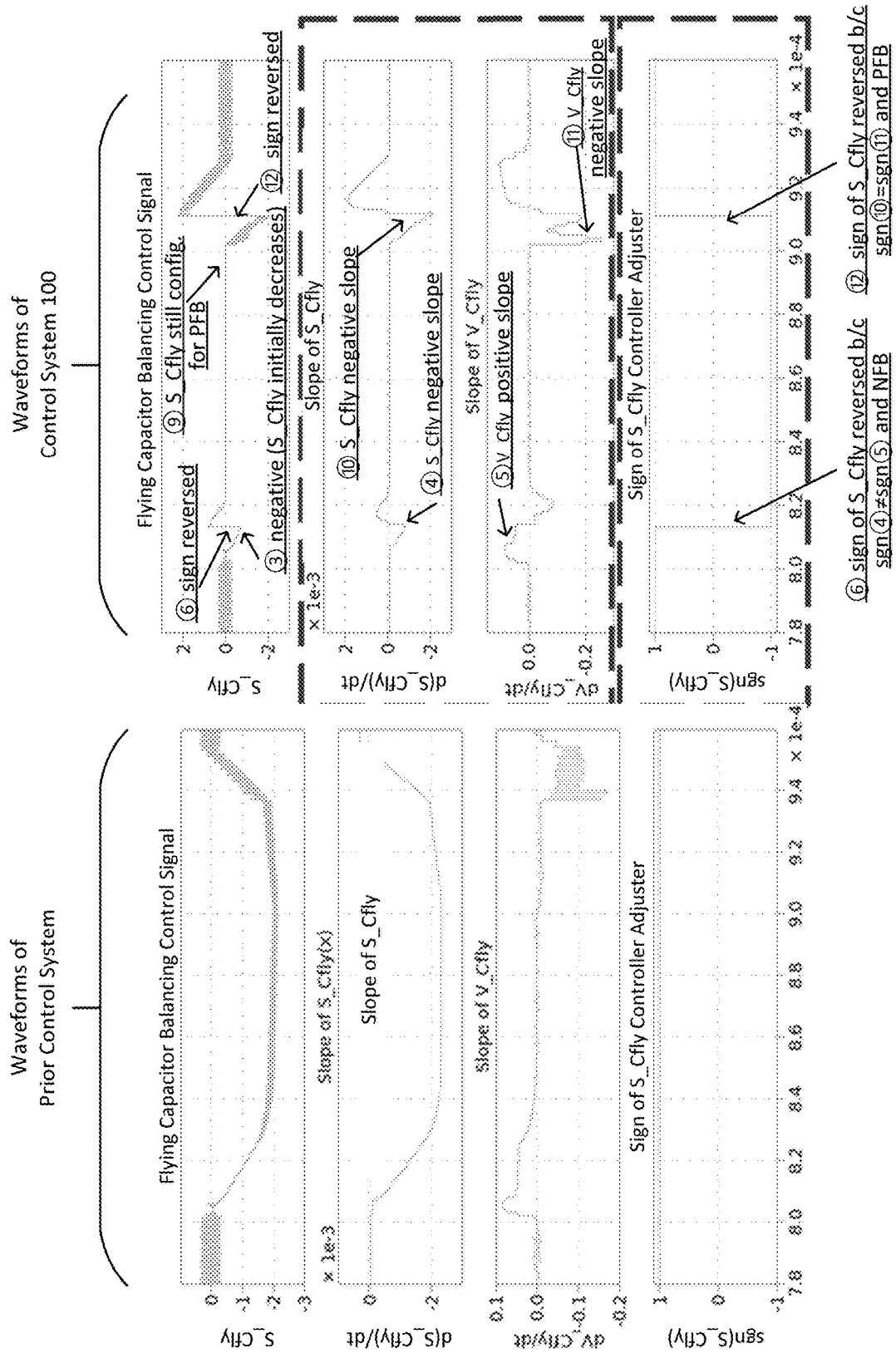

FIGS. 2A and 2B illustrate waveforms comparing a known control system and the control system 100 of FIGS. 1A and 1B. More specifically, FIG. 2A illustrates a comparison of converter waveforms during load change, the left-hand side with the known control system, and the right-hand side with the control system 100. FIG. 2B illustrates a comparison of control system waveforms during this load change, again, the left-hand side of the known control system, and the right-hand side of the control system 100.

Consider first the known control system during the load change—the converter waveforms on the left-hand side of FIG. 2A, and the control signals on the left-hand side of FIG. 2B. The load changes result in different feedback regions.

More specifically, a transient response to load drop from 0.5 A to 1 mA is followed by a load step back to 0.5 A for a MLHFC converter 10. A negative feedback between the difference in duty cycle and the flying capacitor voltage $V_{Cfly}$ can be observed at a load current of 0.5 A. This is the typical operating region considered when designing a flying capacitor balancing loop and analyzing the stability of the MLHFC converter 10. As can be seen in the figures, flying capacitor balancing in known systems achieves regulation of the flying capacitor voltage $V_{Cfly}$ to the required value of $$\frac{V_o}{2}$$

under this load condition. However, after the load current $I_L$ drops to 1 mA, the feedback region changes. The flying capacitor voltage $V_{Cfly}$ increases, although $S_{Cfly}$ (i.e., the control signal responsible for balancing) is negative. Consequently, the MLHFC converter 10 loses output voltage regulation, the flyting capacitor voltage $V_{Cfly}$ drifts, and the stress on the switches increases. Moreover, it can be seen that regulation and flying capacitor balancing are restored after the load increases back to 0.5 A, indicating that the balancing works as intended for the NFB.

Compare now the disclosed control system 100 during the load change—the converter waveforms on the right-hand side of FIG. 2A, and the control signals on the right-hand side of FIG. 2B. Again, the load changes result in different feedback regions.

Output voltage regulation and a balanced flying capacitor voltage $V_{Cfly}$ are achieved by the disclosed control system 100 regardless of the load current $i_{load}$. To ease in an understanding of the right-hand side waveforms, the following encircled numerals represent those in the illustrated waveforms. At first, the sign of $S_{Cfly}$ is still configured by default for the NFB. ① After the load current $i_{load}$ drops from 0.5 A to 1 mA, ② the flying capacitor voltage $V_{Cfly}$ initially increases, ③ while the flying capacitor balancing control signal $S_{Cfly}$ is negative. The feedback region detector 120 detects this change of the feedback region by the different signs of the slopes ④ of the integral of $S_{Cfly}$ $$\left(\text{i.e., } \frac{dS_{Cfly}}{dt}\right)$$

and ⑤ of the flying capacitor voltage $$\left(\text{i.e., } \frac{dV_{Cfly}}{dt}\right).$$

The feedback sign should be reversed because the feedback region detector 120 has detected that the MLHFC converter 10 is in the wrong feedback region and going away from balance. Consequently, ⑥ the feedback sign of $S_{Cfly}$ is reversed and ⑦ the flying capacitor voltage $v_{Cfly}(t)$ is again balanced at $$\frac{V_o}{2}.$$

A similar behavior can be observed as ⑧ the load current $i_{load}$ increases back to 0.5 A. At first, ⑨ the sign of $S_{Cfly}$ is still configured for the PFB. Due to the same signs of the slopes ⑩ of the integral of $S_{Cfly}$ and ⑪ of the flying capacitor voltage $V_{Cfly}$, the flying capacitor voltage $V_{Cfly}$ is going away from balance, so ⑫ the feedback sign of $S_{Cfly}$ is reversed again, ⑬ which results in flying capacitor voltage balancing.

Figure 3:
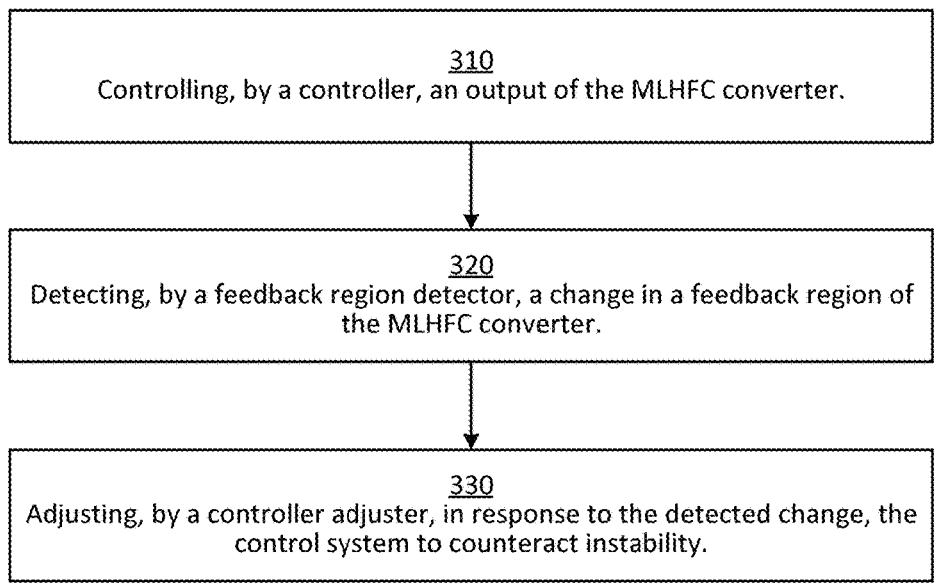
FIG. 3 illustrates a flowchart of a method 300 of a control system controlling an MLHFC converter in accordance with aspects of the disclosure.

FIG. 3 illustrates a flowchart of a method 300 of a control system controlling a MLHFC converter 10 in accordance with aspects of the disclosure.

At Step 310, a controller 110 controls an output of the MLHFC converter 10.

At Step 320, a feedback region detector 130 detects a change in a feedback region of the MLHFC converter 10.

At Step 330, a controller adjuster 120 adjusts, in response to the detected change, the control system 100 to counteract instability.

The control system 100 enables industrial use of MLHFC converters 10 in existing or future systems by eliminating flying capacitor imbalance resulting in converter instabilities. The control system 100 disclosed herein has many advantages. Flying capacitor balancing is maintained under all conditions. It is not necessary to measure inductor current to detect the feedback region. It is not necessary to know converter parameters, operating conditions, or feedback region boundaries. The control system 100 is independent of the control scheme (VMC, CMC, SMC, etc.). And the same control system 100 can be used in all feedback regions, that is, for all load conditions. This control system 100 enables the use of lower rated components in the power stage, allowing for a smaller silicon footprint for the same conductance of the switches, therefore ultimately reducing cost.

The control system 100 may be comprised of any suitable circuit elements such as bipolar transistors, Metal-Oxide Semiconductor Field-Effect Transistors (MOSFETs), or the like.

The techniques of this disclosure may also be described in the following examples.

Example 1

A control system for a Multi-Level Hybrid Flying Capacitor (MLHFC) converter, the control system comprising: a controller configured to control an output of the MLHFC converter; a feedback region detector configured to detect a change in a feedback region of the MLHFC converter; and a controller adjuster configured to, in response to the detected change, adjust the control system to counteract instability.

Example 2

The control system of example 1, wherein the instability results from an operating point change of the MLHFC converter.

Example 3

The control system of any combination of examples 1-2, wherein the instability results from a parameter change of the MLHFC converter.

Example 4

The control system of any combination of examples 1-3, wherein the change in the feedback region of the MLHFC converter is from a negative feedback region to a positive feedback region, or from a positive feedback region to a negative feedback region.

Example 5

The control system of any combination of examples 1-4, wherein the controller adjuster is configured to adjust the control system by inversing a sign of a control signal of the controller.

Example 6

The control system of any combination of examples 1-5, further comprising: a plurality of pairs of feedback region detectors and controller adjusters, wherein the MLHFC converter comprises a plurality of flying capacitors, each of which corresponds with a respective pair of the feedback region detectors and controller adjusters.

Example 7

The control system of any combination of examples 1-6, wherein the control system is controller-architecture independent.

Example 8

The control system of any combination of examples 1-7, wherein the controller comprises a Sliding Mode Controller (SMC), a Current Mode Controller (CMC), a Voltage Mode Controller (VMC), a Proportional Integral Derivative (PID) controller, a hysteresis controller, or a non-linear controller.

Example 9

The control system of any combination of examples 1-8, wherein the controller comprises a Current Mode Controller (CMC).

Example 10

The control system of any combination of examples 1-9, wherein the feedback region detector is configured to detect the change in the feedback region by monitoring a property of a flying capacitor voltage of the MLHFC converter, and a property of a control signal of the controller.

Example 11

The control system of any combination of examples 1-10, wherein the property of the flying capacitor voltage is a sign of a derivative of the flying capacitor voltage of the MLHFC converter, and wherein the property of the control signal is a sign of a derivative of the control signal of the controller.

Example 12

The control system of any combination of examples 1-11, wherein the controller adjuster is configured to adjust the control system by inversing a sign of the control signal of the controller.

Example 13

The control system of any combination of examples 1-12, wherein the feedback region detector is configured to: detect the change in the feedback region from a negative feedback region to a positive feedback region when the sign of the derivative of the flying capacitor voltage and the sign of the derivative of the control signal are not equal, and detect the change in the feedback region from a positive feedback region to a negative feedback region when the sign of the derivative of the flying capacitor voltage and the sign of the derivative of the control signal are equal.

Example 14

The control system of any combination of examples 1-13, wherein the controller adjuster is configured to, if the feedback region detector detects the change in the feedback region from either the negative feedback region to the positive feedback region, or from the positive feedback region to the negative feedback region, adjust the control system by inversing a sign of the control signal of the controller.

Example 15

The control system of any combination of examples 1-14, wherein the feedback region detector is configured to operate independent of parameters of the MLHFC converter, wherein the parameters comprise a load current, an input voltage, an output voltage, a switching frequency, and an inductance.

Example 16

The control system of any combination of examples 1-15, wherein the MLHFC converter is a step-up converter.

Example 17

The control system of any combination of examples 1-16, wherein the MLHFC converter is a step-down converter.

Example 18

A method of a control system controlling a Multi-Level Hybrid Flying Capacitor (MLHFC) converter, the method comprising: controlling, by a controller, an output of the MLHFC converter; detecting, by a feedback region detector, a change in a feedback region of the MLHFC converter; and adjusting, by a controller adjuster, in response to the detected change, the control system to counteract instability.

Example 19

The method of example 18, wherein the change in the feedback region of the MLHFC converter is from a negative feedback region to a positive feedback region, or from a positive feedback region to a negative feedback region.

Example 20

The method of any combination of examples 18-19, wherein the detecting by the feedback region detector comprises: monitoring a property of a flying capacitor voltage of the MLHFC converter, and a property of a control signal of the controller.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A control system for a Multi-Level Hybrid Flying Capacitor (MLHFC) converter, the control system comprising:
    a controller configured to control an output of the MLHFC converter,
    a feedback region detector configured to detect a change in a feedback region of the MLHFC converter by monitoring a property of a flying capacitor voltage of the MLHFC converter and a property of a control signal of the controller; and
    a controller adjuster configured to, in response to the detected change, adjust the control system to counteract instability.

2. The control system of claim 1, wherein the instability results from an operating point change of the MLHFC converter.

3. The control system of claim 1, wherein the instability results from a parameter change of the MLHFC converter.

4. The control system of claim 1, wherein the change in the feedback region of the MLHFC converter is from a negative feedback region to a positive feedback region, or from a positive feedback region to a negative feedback region.

5. The control system of claim 1, wherein the controller adjuster is configured to adjust the control system by inversing a sign of a control signal of the controller.

6. The control system of claim 1, further comprising:
    a plurality of pairs of feedback region detectors and controller adjusters,
    wherein the MLHFC converter comprises a plurality of flying capacitors, each of which corresponds with a respective pair of the feedback region detectors and controller adjusters.

7. The control system of claim 1, wherein the control system is controller-architecture independent.

8. The control system of claim 7, wherein the controller comprises a Sliding Mode Controller (SMC), a Current Mode Controller (CMC), a Voltage Mode Controller (VMC), a Proportional Integral Derivative (PID) controller, a hysteresis controller, or a non-linear controller.

9. The control system of claim 1, wherein the controller comprises a Current Mode Controller (CMC).

10. The control system of claim 1, wherein the property of the flying capacitor voltage is a sign of a derivative of the flying capacitor voltage of the MLHFC converter, and wherein the property of the control signal is a sign of a derivative of the control signal of the controller.

11. The control system of claim 10, wherein the controller adjuster is configured to adjust the control system by inversing a sign of the control signal of the controller.

12. The control system of claim 10, wherein the feedback region detector is configured to:
    detect the change in the feedback region from a negative feedback region to a positive feedback region when the sign of the derivative of the flying capacitor voltage and the sign of the derivative of the control signal are not equal, and
    detect the change in the feedback region from a positive feedback region to a negative feedback region when the sign of the derivative of the flying capacitor voltage and the sign of the derivative of the control signal are equal.

13. The control system of claim 12, wherein the controller adjuster is configured to, if the feedback region detector detects the change in the feedback region from either the negative feedback region to the positive feedback region, or from the positive feedback region to the negative feedback region, adjust the control system by inversing a sign of the control signal of the controller.

14. The control system of claim 1, wherein the MLHFC converter is a step-up converter.

15. The control system of claim 1, wherein the MLHFC converter is a step-down converter.

16. A control system for a Multi-Level Hybrid Flying Capacitor (MLHFC) converter, the control system comprising: a controller configured to control an output of the MLHFC converter; a feedback region detector configured to detect a change in a feedback region of the MLHFC converter, and to operate independent of parameters of the MLHFC converter, wherein the parameters comprise a load current, an input voltage, a switching frequency, and an inductance; and a controller adjuster configured to, in response to the detected change, adjust the control system to counteract instability.

17. A method of a control system controlling a Multi-Level Hybrid Flying Capacitor (MLHFC) converter, the method comprising:
    controlling, by a controller, an output of the MLHFC converter,
    detecting, by a feedback region detector, a change in a feedback region of the MLHFC converter by monitoring a property of a flying capacitor voltage of the MLHFC converter and a property of a control signal of the controller; and
    adjusting, by a controller adjuster, in response to the detected change, the control system to counteract instability.

18. The method of claim 17, wherein the change in the feedback region of the MLHFC converter is from a negative feedback region to a positive feedback region, or from a positive feedback region to a negative feedback region.

19. The method of claim 17, wherein the detecting by the feedback region detector comprises:
    monitoring a property of a flying capacitor voltage of the MLHFC converter, and a property of a control signal of the controller.

20. The method of claim 17, wherein the feedback region detector is configured to operate independent of parameters of the MLHFC converter, and the parameters comprise a load current, an input voltage, an output voltage, a switching frequency, and an inductance.

* * * * *